(12) United States Patent
Hong et al.

(10) Patent No.: US 8,008,784 B2
(45) Date of Patent: Aug. 30, 2011

(54) PACKAGE INCLUDING A LEAD FRAME, A CHIP AND A SEALANT

(75) Inventors: Young-Moon Hong, Gyeonggi-Do (KR); Chang-Suk Han, Gyeonggi-Do (KR); Chang-Won Park, Gyeonggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 310 days.

(21) Appl. No.: 12/285,346

(22) Filed: Oct. 2, 2008

(65) Prior Publication Data
US 2010/0084749 A1 Apr. 8, 2010

(51) Int. Cl.
*H01L 23/52* (2006.01)
(52) U.S. Cl. ........ 257/784; 257/666; 257/690; 257/786; 257/E23.039
(58) Field of Classification Search .......... 257/666–672, 257/784–787, 723
See application file for complete search history.

(56) References Cited

U.S. PATENT DOCUMENTS

| | | | | |
|---|---|---|---|---|
| 6,730,544 B1 * | 5/2004 | Yang | | 438/110 |
| 6,812,552 B2 * | 11/2004 | Islam et al. | | 257/666 |
| 2006/0170081 A1 | 8/2006 | Gerber et al. | | |

* cited by examiner

*Primary Examiner* — Dung A. Le
(74) *Attorney, Agent, or Firm* — Bacon & Thomas, PLLC

(57) ABSTRACT

A package and a fabricating method thereof are provided. The package includes a lead frame, a chip and a sealant. The lead frame has a notch and a plurality of first notch-side leads, a plurality of first notch-side pads, a plurality of second notch-side leads and a plurality of second notch-side pads. The first notch-side leads extend to a first side of the notch. The first notch-side pads are correspondingly disposed on the first notch-side leads. The second notch-side leads extend to a second side of the notch. The second notch-side pads are correspondingly disposed on the second notch-side leads. The sealant seals up the chip and the lead frame and exposes a lower surface of the lead frame. The notch exposes a portion of the sealant.

17 Claims, 5 Drawing Sheets

PACKAGE INCLUDING A LEAD FRAME, A CHIP AND A SEALANT

BACKGROUND OF THE INVENTION

1. Field of the Invention

The invention relates in general to a package and a fabricating method thereof, and more particularly to a package having a notch and a fabricating method thereof.

2. Description of the Related Art

With the flourishing development of the electronic industry, the semiconductor package technology is progressing continuously. In general, a lead frame is utilized to support a chip, and a sealant is utilized to seal up the lead frame and a substrate in the semiconductor package technology to prevent the chip from being dampened or from being damaged by collision. The chip is further electrically connected to the outside via pads of the lead frame so that the chip can be electrically connected to a printed circuit board.

However, the size of the package structure is continuously reduced under the trend of manufacturing the miniaturized electronic product.

SUMMARY OF THE INVENTION

The invention is directed to a package and a fabricating method thereof, wherein the miniaturized target of the package is satisfied according to the design of a lead frame.

According to a first aspect of the present invention, a package is provided. The package includes a lead frame, a chip, a plurality of conductive bumps and a sealant. The lead frame has a notch and a first edge and a second edge opposite to the first edge. A first side of the notch is substantially parallel to the first edge, and a second side of the notch is substantially parallel to the second edge. The lead frame includes a plurality of first notch-side leads, a plurality of first notch-side pads, a plurality of second notch-side leads and a plurality of second notch-side pads. The first notch-side leads extend to the first side. The first notch-side pads are correspondingly disposed on the first notch-side leads. The second notch-side leads extend to the second side. The second notch-side pads are correspondingly disposed on the second notch-side leads. The chip disposed on an upper surface of the lead frame has a plurality of pads. The conductive bumps electrically connect the pads to the first notch-side pads and the second notch-side pads. The sealant seals up the chip, the conductive bumps and the lead frame, and exposes a lower surface of the lead frame. The notch exposes a portion of the sealant.

According to a second aspect of the present invention, a fabricating method of a package is provided. The fabricating method includes the following steps. First, a lead frame, which has a groove and a first edge and a second edge opposite to the first edge, is provided. A first side of the groove is substantially parallel to the first edge. A second side of the groove is substantially parallel to the second edge. The lead frame includes a plurality of first notch-side leads, a plurality of first notch-side pads, a plurality of second notch-side leads and a plurality of second notch-side pads. The first notch-side leads extend to the first side. The first notch-side pads are correspondingly disposed on the first notch-side leads. The second notch-side leads extend to the second side. The second notch-side pads are correspondingly disposed on the second notch-side leads. Next, a chip having a plurality of pads is provided. Then, a plurality of conductive bumps is disposed on the pads. Next, the pads are electrically connected to the first notch-side pads and the second notch-side pads via the conductive bumps. Then, a sealant is provided to seal up the chip, the conductive bumps and the lead frame and exposes a lower surface of the lead frame. Next, the lead frame is cut along the groove to form a notch, which exposes a portion of the sealant.

The invention will become apparent from the following detailed description of the preferred but non-limiting embodiments. The following description is made with reference to the accompanying drawings.

DETAILED DESCRIPTION OF THE INVENTION

Figure 1:
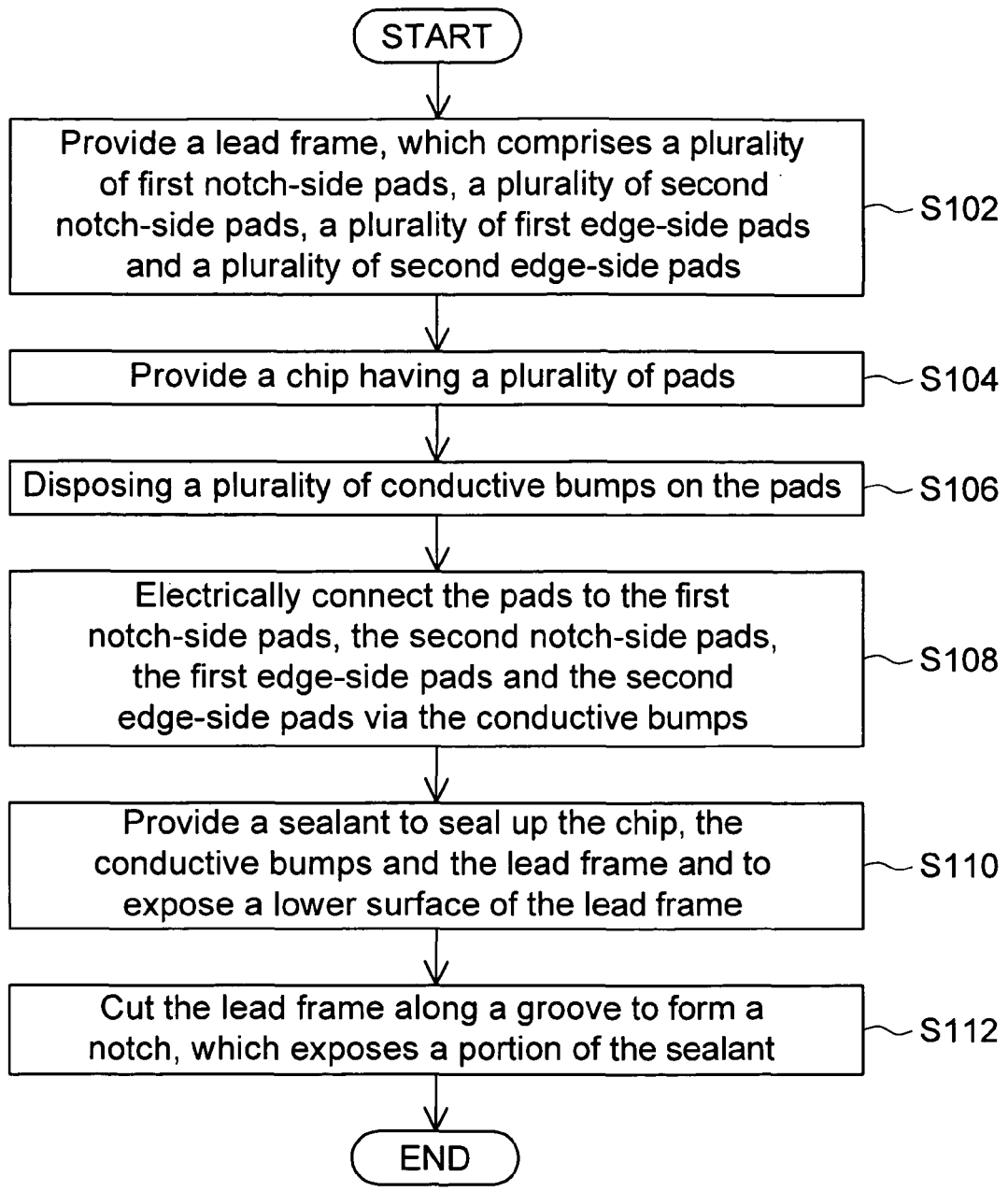
FIG. 1 is a flow chart showing a fabricating method of a package according to a preferred embodiment of the invention.

FIG. 1 is a flow chart showing a fabricating method of a package according to a preferred embodiment of the invention. Referring to FIG. 1, the fabricating method includes the following steps.

Figure 2:
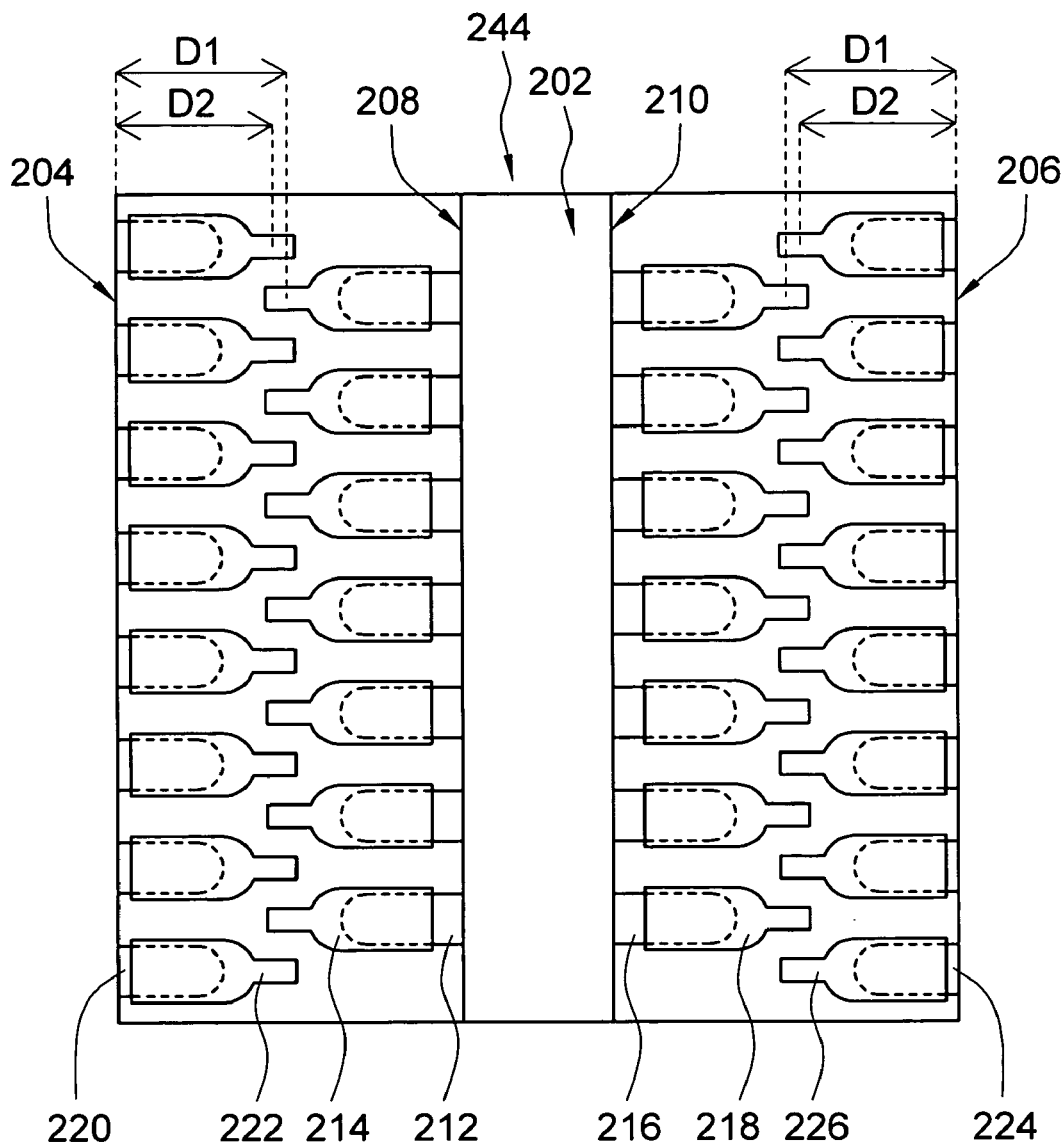
FIG. 2 is a top view showing a lead frame of the package according to the embodiment of the invention.

FIG. 2 is a top view showing a lead frame of the package according to the embodiment of the invention. As shown in FIG. 2, a lead frame 200 is provided in step S102. The lead frame 200 has a groove 202 and a first edge 204 and a second edge 206 opposite to the first edge 204. The groove 202 has a first side 208 substantially parallel to the first edge 204, and a second side 210 substantially parallel to the second edge 206. The groove is substantially located at a middle position 244 between the first edge 204 and the second edge 206. The lead frame 200 includes a plurality of first notch-side leads 212, a plurality of first notch-side pads 214, a plurality of second notch-side leads 216 and a plurality of second notch-side pads 218. The first notch-side leads 212 extend to the first side 208, and the first notch-side pads 214 are correspondingly disposed on the first notch-side leads 212. The second notch-side leads 216 extend to the second side 210, and the second notch-side pads 218 are correspondingly disposed on the second notch-side leads 216. In addition, the lead frame 200 further includes a plurality of first edge-side leads 220, a plurality of first edge-side pads 222, a plurality of second edge-side leads 224 and a plurality of second edge-side pads 226. The first edge-side leads 220 extend to the first edge 204. The first edge-side pads 222 are correspondingly disposed on the first edge-side leads 220. The second edge-side leads 224 extend to the second edge 206. The second edge-side pads 226 are correspondingly disposed on the second edge-side leads 224.

In addition, as shown in FIG. 2, the first notch-side pads 214 and the first edge-side pads 222 are arranged alternately, and the second notch-side pads 218 and the second edge-side pads 226 are arranged alternately. The spaces between the pads are optimized because the pads are arranged alternately so that the number of pads, which can be accommodated within the lead frame 200, is increased. Preferably, each of the first notch-side pads 214 and each of the second notch-side pads 218 extend by a first distance D1 inwards from the first edge 204 and the second edge 206, respectively. Each of the first edge-side pads 222 and each of the second edge-side pads 226 extend by a second distance D2 inwards from the first edge 204 and the second edge 206, respectively. The first distance D1 is greater than the second distance D2. That is, the lead frame 200 can accommodate more pads by regularly arranging the first notch-side pads 214, the second notch-side pads 218, the first edge-side pads 222 and the second edge-side pads 226.

Figure 3:
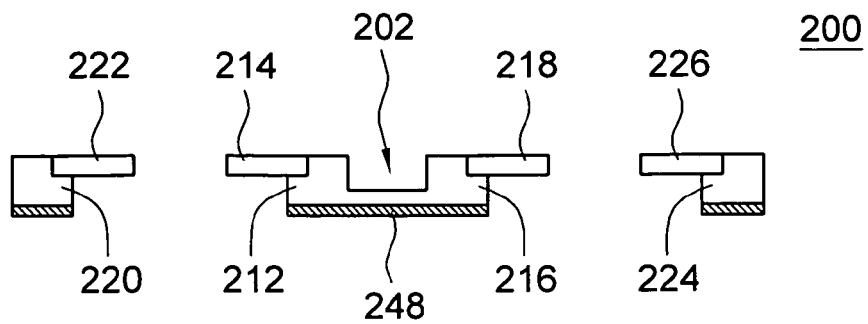
FIG. 3 is a front view showing the lead frame of FIG. 2.

In addition, the lead frame 200 of this embodiment is a pre-plating lead frame (PPF). FIG. 3 is a front view showing the lead frame of FIG. 2. The lead frame has been pre-plated with an anti-oxidation metal layer 248, such as a nickel palladium gold (Ni—Pd—Au) alloy.

Figure 4:
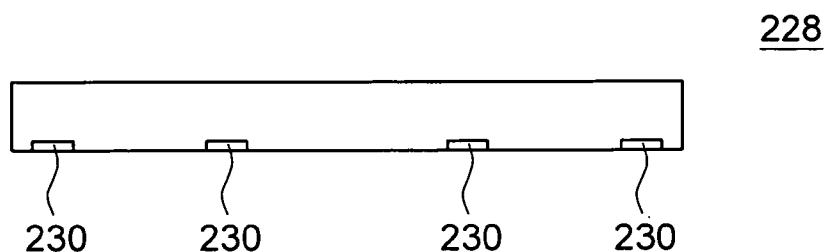
FIG. 4 is a schematic illustration showing a chip according to the embodiment of the invention.

FIG. 4 is a schematic illustration showing a chip according to the embodiment of the invention. Next, in step S104, a chip 228 having a plurality of pads 230 is provided.

Figure 5:
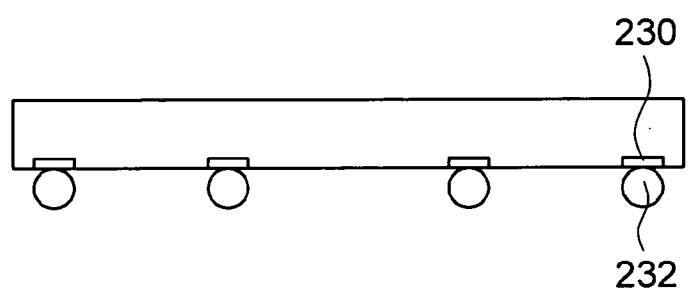
FIG. 5 is a schematic illustration showing the chip with conductive bumps according to the embodiment of the invention.

FIG. 5 is a schematic illustration showing the chip with conductive bumps according to the embodiment of the invention. Then, in step S106, a plurality of conductive bumps 232 is disposed on the pads 230.

Figure 6:
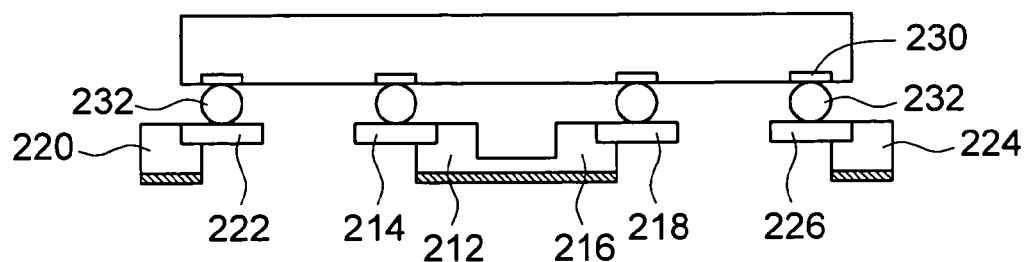
FIG. 6 is a schematic illustration showing the lead frame with the chip according to the embodiment of the invention.

FIG. 6 is a schematic illustration showing the lead frame with the chip according to the embodiment of the invention. Next, in step S108, the conductive bumps 232 electrically connect the pads 230 to the first notch-side pads 214, the second notch-side pads 218, the first edge-side pads 222 and the second edge-side pads 226.

Figure 7:
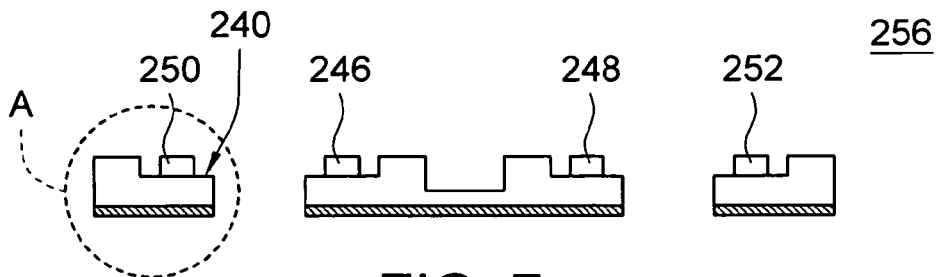
FIG. 7 is a schematic illustration showing another aspect of the lead frame according to this embodiment of the invention.

In addition, although the first notch-side pads 214, the second notch-side pads 218, the first edge-side pads 222 and the second edge-side pads 226 are formed on the lead frame 200 in a manner shown in FIG. 6. In other embodiment, however, the first notch-side pads 214, the second notch-side pads 218, the first edge-side pads 222 and the second edge-side pads 226 may also be formed on the lead frame 200 in other manners. FIG. 7 is a schematic illustration showing another aspect of the lead frame according to this embodiment of the invention. For example, external shapes of a first notch-side pad 246, a second notch-side pad 248, a first edge-side pad 250 and a second edge-side pad 252 of a lead frame 256 are columns projecting from an upper surface 240 of the lead frame 200.

Figure 8:
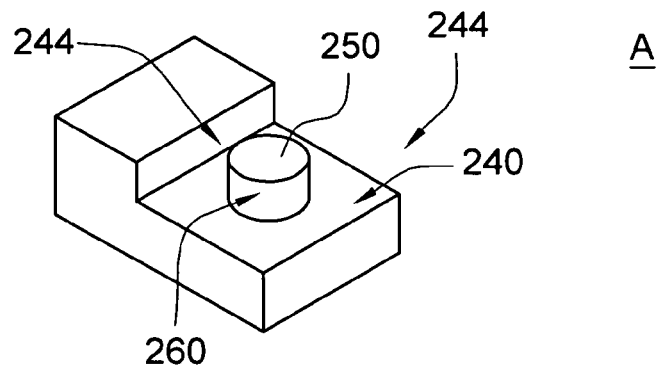
FIG. 8 is a pictorial view showing the region A of FIG. 7.

FIG. 8 is a pictorial view showing the region A of FIG. 7. As shown in FIG. 8, the first edge-side pad 250 is disposed on the lead frame 200 in the form of column, so a concave portion 244 is formed around the column, and the concave portion 244 makes a side surface 260 of the column be exposed. After the conductive bumps 232 (see FIG. 6) are disposed on the first edge-side pads 250, the contact areas between the melted conductive bumps 232 and the first edge-side pads 250 are enlarged in the subsequent reflowing process. As the contact surface is enlarged, the surface tension is also increased so that the bonding strengths between the conductive bumps 232 and the first edge-side pads 250 get stronger. Thus, the conductive bumps 232 cannot be easily dislocated so that the alignments between the conductive bumps 232 and the first edge-side pads 250 are enhanced. Similarly, the first notch-side pads 246, the second notch-side pads 248 and the second edge-side pads 252 also have the same effect.

Figure 9:
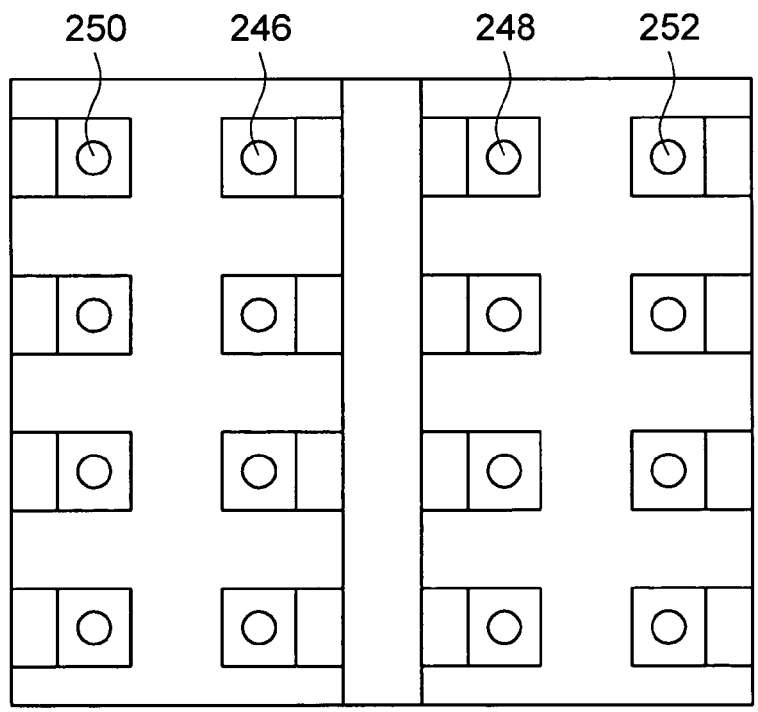
FIG. 9 is a top view showing the lead frame of FIG. 7.

FIG. 9 is a top view showing the lead frame of FIG. 7. Referring also to FIG. 9, the first notch-side pads 246, the second notch-side pads 248, the first edge-side pads 250 and the second edge-side pads 252 have circular cross-sectional shape. Although the cross-sectional shape of the column is circular in the illustrated example, the cross-sectional shape of the column may also be triangular or quadrangular in other embodiments. So, the shape of the column is not restricted by the lead frame of FIG. 9.

Figure 10:
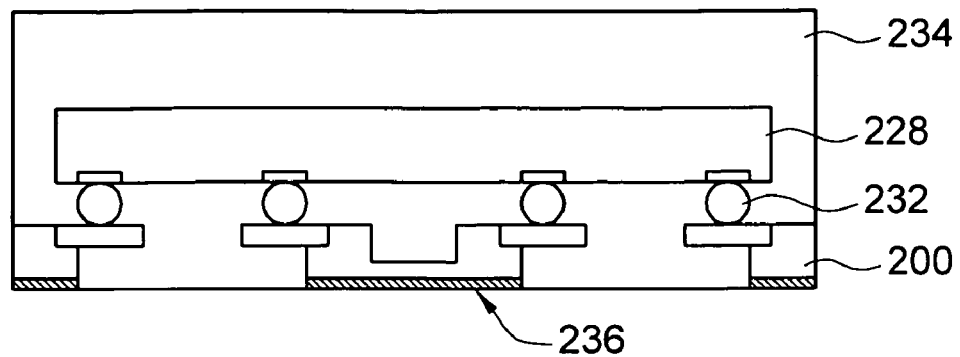
FIG. 10 is a schematic illustration showing a sealant for sealing up the lead frame, the chip and the conductive bumps of FIG. 7.

FIG. 10 is a schematic illustration showing a sealant for sealing up the lead frame, the chip and the conductive bumps of FIG. 7. In step S110, a sealant 234 is provided to seal up the chip 228, the conductive bumps 232 and the lead frame 200 and to expose a lower surface 236 of the lead frame 200.

In addition, although the lead frame 200 of this embodiment is the pre-plating lead frame, the lead frame 200 of FIG. 2 is not limited thereto. For example, if the lead frame 200 is not the pre-plating lead frame, an anti-oxidation metal layer, such as tin (Sn) or an tin-lead (Sn—Pb) alloy is formed on the bottom surface of the lead frame 200 by way of plating, for example, after the step S110. That is, if the lead frame 200 of FIG. 2 does not have the anti-oxidation metal layer, the anti-oxidation metal layer may also be formed after the step S110 of this embodiment.

Figure 11:
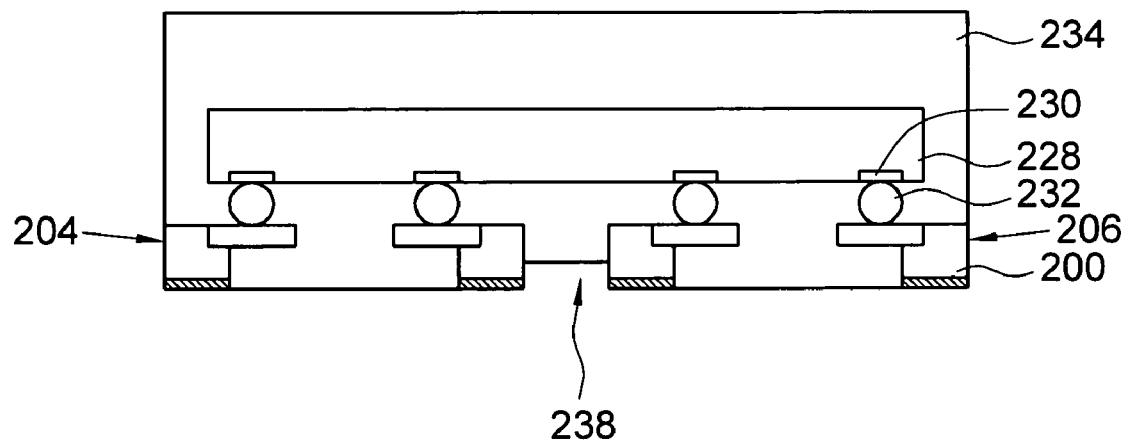
FIG. 11 is a schematic illustration showing a package according to the preferred embodiment of the invention.

FIG. 11 is a schematic illustration showing a package according to the preferred embodiment of the invention. Then, in step S112, the lead frame 200 is cut along the groove 202 to form a notch 238 for exposing a portion of the sealant 234. Because the groove 202 is substantially located at the middle position 244 between the first edge 204 and the second edge 206, the cut notch 238 is also substantially located at the same position. In the step S112, because the lead frame 200 is formed with the groove 202 in advance, the notch 238 can be easily cut by a cutting tool or laser. Heretofore, the package 262 according to the preferred embodiment of the invention is completed.

The package and the fabricating method thereof according to the embodiment of the invention have the following advantages, wherein some of the advantages will be described in the following.

First, the first notch-side pads, the first edge-side pads, the second notch-side pads and the second edge-side pads are arranged in arrays, so the lead frame can accommodate more pads.

Second, the first notch-side pads and the first edge-side pads are arranged alternately and the second notch-side pads and the second edge-side pads are also arranged alternately. So, the lead frame can accommodate more pads when the spaces between the pads are optimized.

Third, the first notch-side pads, the second notch-side pads, the first edge-side pads and the second edge-side pads are formed on the lead frame in the form of columns. So, the surface contact areas between the conductive bumps and the pads are enlarged in the reflowing process. The surface tension is increased as the surface contact area is enlarged. Thus, the conductive bumps cannot be easily dislocated in the reflowing process.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package, comprising:
    a lead frame, which has a notch and a first edge and a second edge opposite to the first edge, wherein a first side of the notch is substantially parallel to the first edge, and a second side of the notch is substantially parallel to the second edge, and the lead frame comprises:
    a plurality of first notch-side leads extending to the first side;
    a plurality of first notch-side pads correspondingly disposed on the first notch-side leads;
    a plurality of second notch-side leads extending to the second side; and
    a plurality of second notch-side pads correspondingly disposed on the second notch-side leads;
    a chip, which is disposed on an upper surface of the lead frame and has a plurality of pads;
    a plurality of conductive bumps for electrically connecting the pads to the first notch-side pads and the second notch-side pads; and
    a sealant for sealing up the chip, the conductive bumps and the lead frame and exposing a lower surface of the lead frame,
    wherein the notch exposes a portion of the sealant.

2. The package according to claim 1, wherein the lead frame further comprises:
    a plurality of first edge-side leads extending to the first edge;
    a plurality of first edge-side pads correspondingly disposed on the first edge-side leads;
    a plurality of second edge-side leads extending to the second edge; and
    a plurality of second edge-side pads correspondingly disposed on the second edge-side leads,
    wherein the conductive bumps are further electrically connected to the pads, the first edge-side pads and the second edge-side pads.

3. The package according to claim 2, wherein the first notch-side pads and the first edge-side pads are arranged alternately, and the second notch-side pads and the second edge-side pads are arranged alternately.

4. The package according to claim 2, wherein each of the first notch-side pads and each of the second notch-side pads extend by a first distance inwards respectively from the first edge and the second edge, each of the first edge-side pads and each of the second edge-side pads extend by a second distance inwards respectively from the first edge and the second edge, and the first distance is greater than the second distance.

5. The package according to claim 2, wherein external shapes of the first notch-side pads, the second notch-side pads, the first edge-side pads and the second edge-side pads are columns projecting from the upper surface of the lead frame.

6. The package according to claim 5, wherein a cross-sectional shape of the column is circular, triangular or quadrangular.

7. The package according to claim 1, wherein the notch is substantially located at a middle position between the first edge and the second edge.

8. The package according to claim 1, wherein the lead frame is a copper lead frame.

9. The package according to claim 1, wherein the lead frame is a pre-plating lead frame (PPF).

10. A lead frame, comprising:
    a first edge and a second edge opposite to the first edge;
    a notch having a first side substantially parallel to the first edge and a second side substantially parallel to the second edge;
    a plurality of first notch-side leads extending to the first side;
    a plurality of first notch-side pads correspondingly disposed on the first notch-side leads;
    a plurality of second notch-side leads extending to the second side;
    a plurality of second notch-side pads correspondingly disposed on the second notch-side leads;
    a plurality of first edge-side leads extending to the first edge;
    a plurality of first edge-side pads correspondingly disposed on the first edge-side leads;
    a plurality of second edge-side leads extending to the second edge; and
    a plurality of second edge-side pads correspondingly disposed on the second edge-side leads.

11. The lead frame according to claim 10, wherein the first notch-side pads and the first edge-side pads are arranged alternately, and the second notch-side pads and the second edge-side pads are arranged alternately.

12. The lead frame according to claim 10, wherein each of the first notch-side pads and each of the second notch-side pads extend by a first distance inwards respectively from the first edge and the second edge, each of the first edge-side pads and each of the second edge-side pads extend by a second distance inwards respectively from the first edge and the second edge, and the first distance is greater than the second distance.

13. The lead frame according to claim 10, wherein external shapes of the first notch-side pads, the second notch-side pads, the first edge-side pads and the second edge-side pads are columns projecting from the upper surface of the lead frame.

14. The lead frame according to claim 13, wherein a cross-sectional shape of the column is circular, triangular or quadrangular.

15. The lead frame according to claim 10, wherein the notch is substantially located at a middle position between the first edge and the second edge.

16. The lead frame according to claim 10, wherein the lead frame is a copper lead frame.

17. The lead frame according to claim 10, wherein the lead frame is a pre-plating lead frame (PPF).

* * * * *